(12) United States Patent
Hsiao

(10) Patent No.: US 11,039,549 B2
(45) Date of Patent: Jun. 15, 2021

(54) HEAT TRANSFERRING MODULE

(71) Applicant: HTC Corporation, Taoyuan (TW)

(72) Inventor: Ya-Lin Hsiao, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 15/880,544

(22) Filed: Jan. 26, 2018

(65) Prior Publication Data

US 2019/0239391 A1 Aug. 1, 2019

(51) Int. Cl.
*H05K 7/20* (2006.01)
*G06F 1/20* (2006.01)
*F28F 13/06* (2006.01)

(52) U.S. Cl.
CPC ......... *H05K 7/20336* (2013.01); *F28F 13/06* (2013.01); *G06F 1/203* (2013.01); *F28F 2225/04* (2013.01)

(58) Field of Classification Search
CPC .......... F28D 15/04; F28F 13/06; G06F 1/203; H05K 7/20336; H05K 7/20309
See application file for complete search history.

(56) References Cited

U.S. PATENT DOCUMENTS

| | | | | |
|---|---|---|---|---|
| 5,647,430 A | * | 7/1997 | Tajima | F28D 15/0266 165/104.21 |
| 9,939,858 B2 | * | 4/2018 | Lin | G06F 1/203 |
| 2002/0080584 A1 | | 6/2002 | Prasher et al. | |
| 2008/0093055 A1 | | 4/2008 | Tzeng et al. | |
| 2008/0236794 A1 | | 10/2008 | St. Louis | |
| 2010/0263834 A1 | * | 10/2010 | Hwang | F28D 15/0275 165/104.26 |
| 2013/0206369 A1 | * | 8/2013 | Lin | F28D 15/043 165/104.26 |
| 2013/0329357 A1 | | 12/2013 | Degner et al. | |
| 2014/0182819 A1 | * | 7/2014 | Yang | F28D 15/04 165/104.26 |
| 2015/0212558 A1 | | 7/2015 | Lin et al. | |
| 2016/0128233 A1 | * | 5/2016 | Lai | G06F 1/1626 165/104.26 |

(Continued)

FOREIGN PATENT DOCUMENTS

| CN | 2685964 | 3/2005 |
|---|---|---|
| CN | 201892459 | 7/2011 |

(Continued)

OTHER PUBLICATIONS

"Office Action of Taiwan Counterpart Application," dated Aug. 6, 2018, pp. 1-4.

(Continued)

*Primary Examiner* — Gordon A Jones
(74) *Attorney, Agent, or Firm* — JCIPRNET

(57) ABSTRACT

A heat transferring module adapted to contact a heating element is provided. The heat transferring module includes a first plate, a second plate and a working fluid. The second plate is connected to the first plate to form a cavity therewith, and the cavity extends along an extension direction of a reference plane. The working fluid is located in the cavity, wherein the cavity is a first area, and a portion of the first plate or a portion of the second plate extending beyond the cavity is a second area. The first area transfers heat by heat convection, and the second area transfers heat by heat conduction.

7 Claims, 8 Drawing Sheets

(56) References Cited

U.S. PATENT DOCUMENTS

| | | |
|---|---|---|
| 2017/0020032 A1 | 1/2017 | Wang et al. |
| 2017/0153066 A1* | 6/2017 | Lin .......................... F28F 1/32 |
| 2018/0279463 A1* | 9/2018 | Zhao ..................... F28D 15/04 |
| 2020/0113084 A1* | 4/2020 | He .......................... G06F 1/20 |

FOREIGN PATENT DOCUMENTS

| | | |
|---|---|---|
| CN | 205726844 | 11/2016 |
| EP | 3144771 | 3/2017 |
| JP | H0566096 | 3/1993 |
| KR | 20080010334 | 1/2008 |
| TW | 200702611 | 1/2007 |
| TW | I289652 | 11/2007 |
| TW | M358298 | 6/2009 |

OTHER PUBLICATIONS

"Search Report of Europe Counterpart Application", dated Nov. 19, 2018, p. 1-p. 4.

"Office Action of Europe Counterpart Application", dated Nov. 29, 2018, p. 1-p. 6.

"Office Action of Europe Counterpart Application", dated Oct. 25, 2019, p. 1-p. 6.

"Office Action of China Counterpart Application", dated May 18, 2020, p. 1-p. 6.

"Office Action of China Counterpart Application", dated Oct. 19, 2020, pp. 1-5.

\* cited by examiner

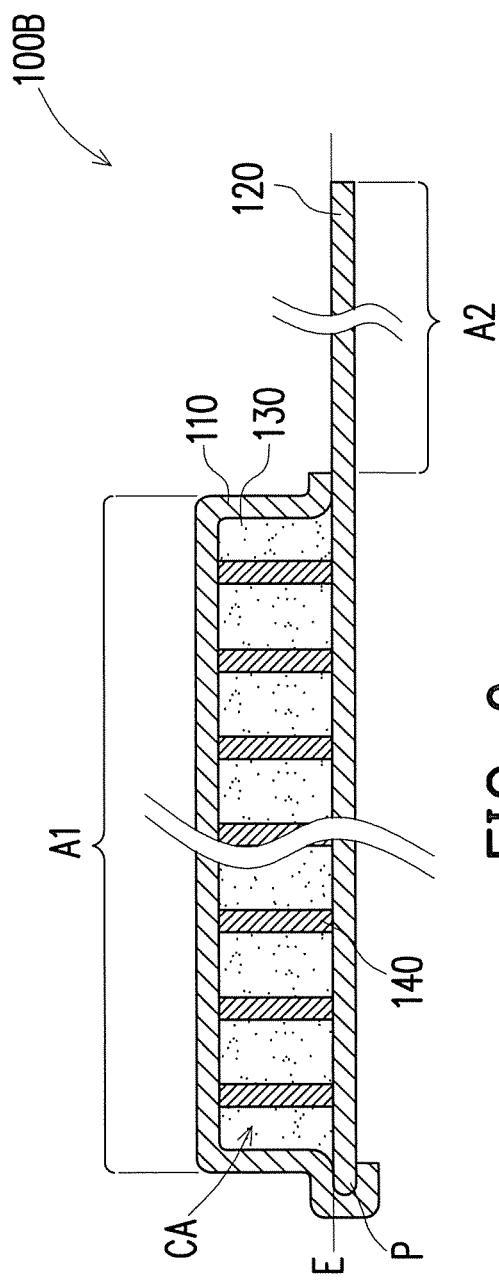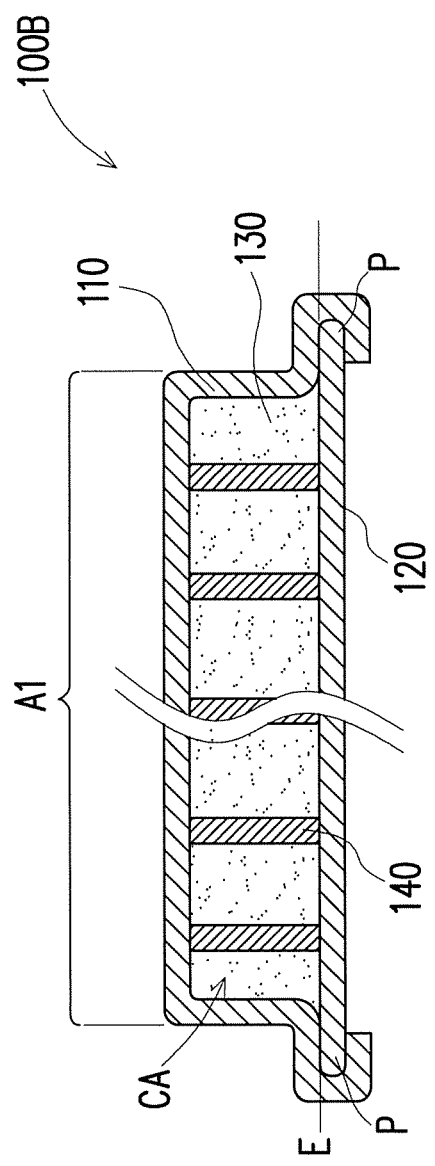

HEAT TRANSFERRING MODULE

BACKGROUND

Technical Field

The application relates to an electronic apparatus, particularly to a casing of an electronic apparatus.

Description of Related Art

In recent years, with the development of the technology industry, information products, for example, electronic apparatuses such as notebook computers, tablet computers and mobile phones, have been widely used in daily life. The types and functions of the electronic apparatuses are becoming more and more diverse, and these electronic apparatuses become more popular because of the convenience and usability.

A central processing unit (CPU), a processing chip or other electronic components may be disposed in an electronic apparatus, and these electronic components generate heat during operation. However, as the volume of the electronic apparatus decreases and the electronic components are more and more densely arranged, a problem of heat accumulation in the electronic apparatus is becoming more and more difficult to deal with and often causes the electronic apparatus to crash due to heat. Therefore, improving heat dissipation is becoming more and more important.

SUMMARY

The application provides a heat transferring module which may enhance a heat dissipation effect of an electronic apparatus and reduces occupied space.

The heat transferring module of the application is adapted to contact a heating element. The heat transferring module includes a first plate, a second plate and a working fluid. The second plate is connected to the first plate to form a cavity therewith, and the cavity extends along an extension direction of a reference plane. The working fluid is located in the cavity, wherein the cavity is a first area, and a portion of the first plate or a portion of the second plate extending beyond the cavity is a second area. The first area transfers heat by heat convection, and the second area transfers heat by heat conduction.

Based on the above, the heat transferring module of the application has the first area and the second area connected to each other in a horizontal direction. In addition, in a vertical direction, the heating element and the first area partially overlap, while the heating element and the second area do not overlap each other. Thus, heat emitted by the heating element may first be transferred to the second area by heat convection in the first area, and then be transferred to a heat dissipating element or the outside by heat conduction in the second area, so as to achieve the effect of heat dissipation. Meanwhile, the space occupied by the heat transferring module may be reduced.

To make the above features and advantages of the invention more comprehensible, embodiments accompanied with drawings are described in detail as follows.

BRIEF DESCRIPTION OF THE DRAWINGS

FIG. 9 is a schematic cross-sectional view of the heat transferring module in FIG. 7 along line G-G.

FIG. 10 is a schematic cross-sectional view of the heat transferring module in FIG. 7 along line H-H.

DESCRIPTION OF THE EMBODIMENTS

Figure 1:
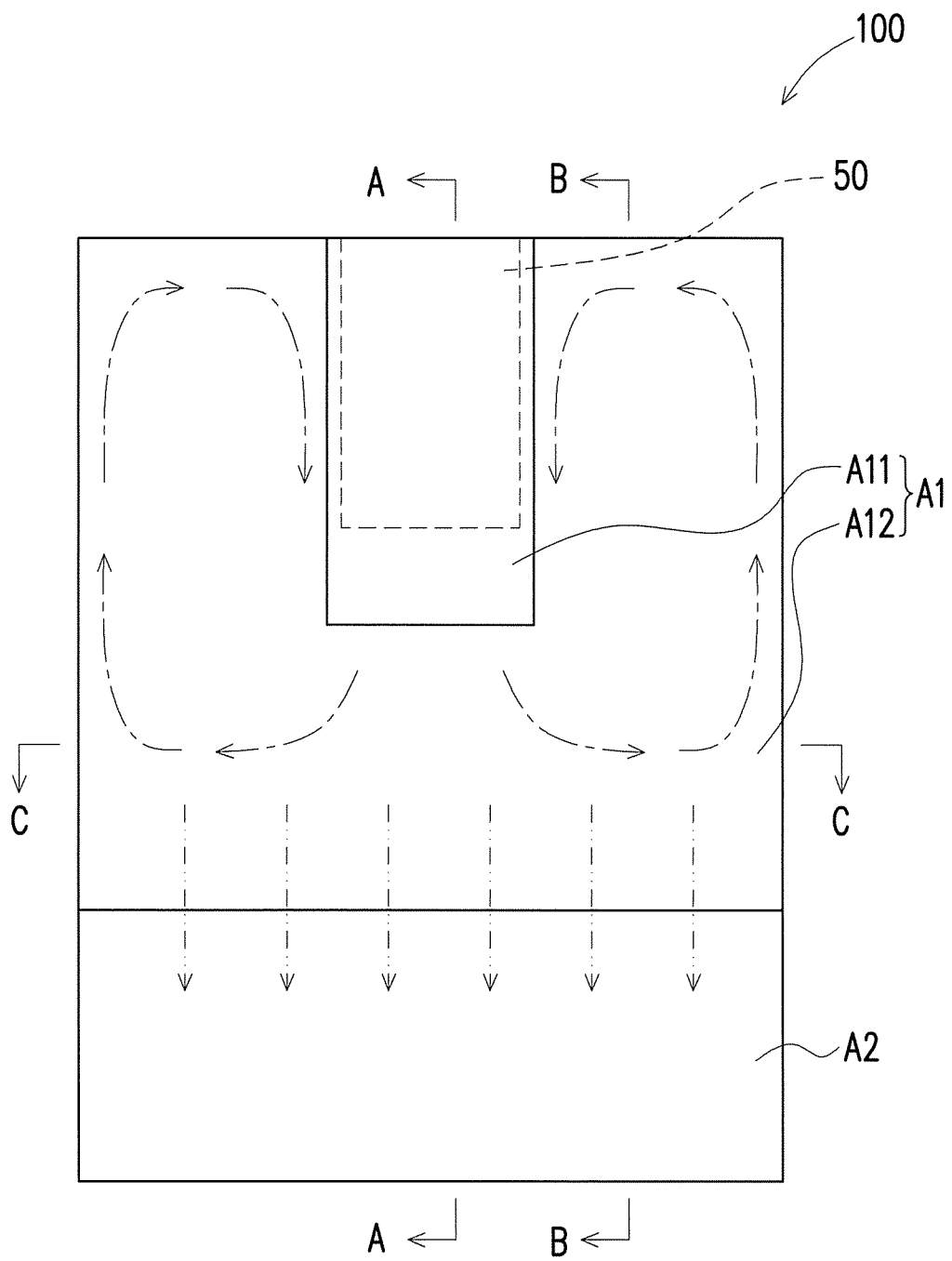
FIG. 1 is a schematic top view of a heat transferring module according to an embodiment of the invention.
Figure 2:
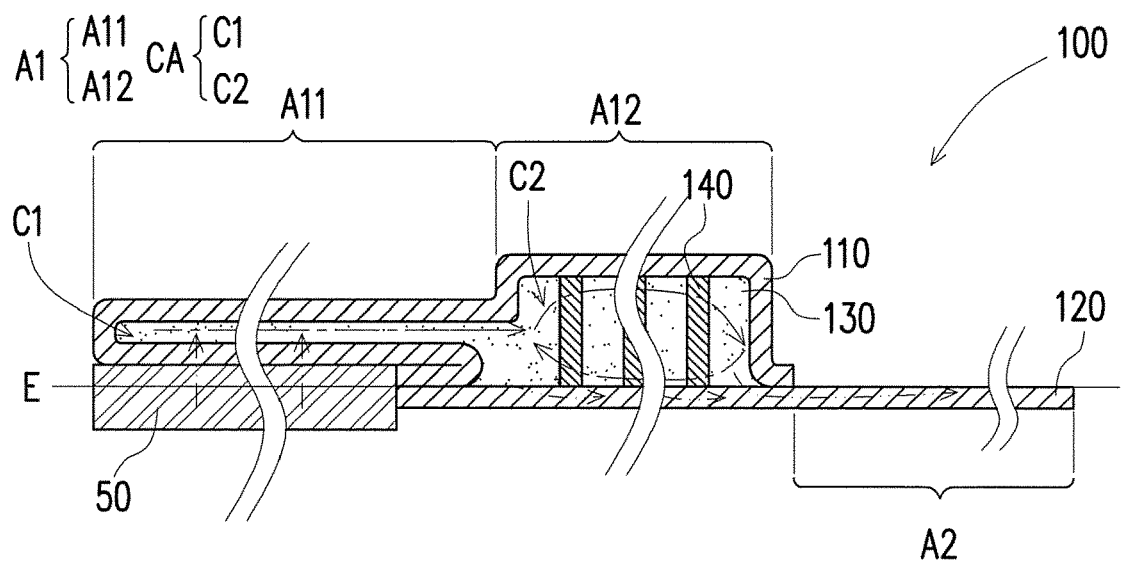
FIG. 2 is a schematic cross-sectional view of the heat transferring module in FIG. 1 along line A-A.
Figure 3:
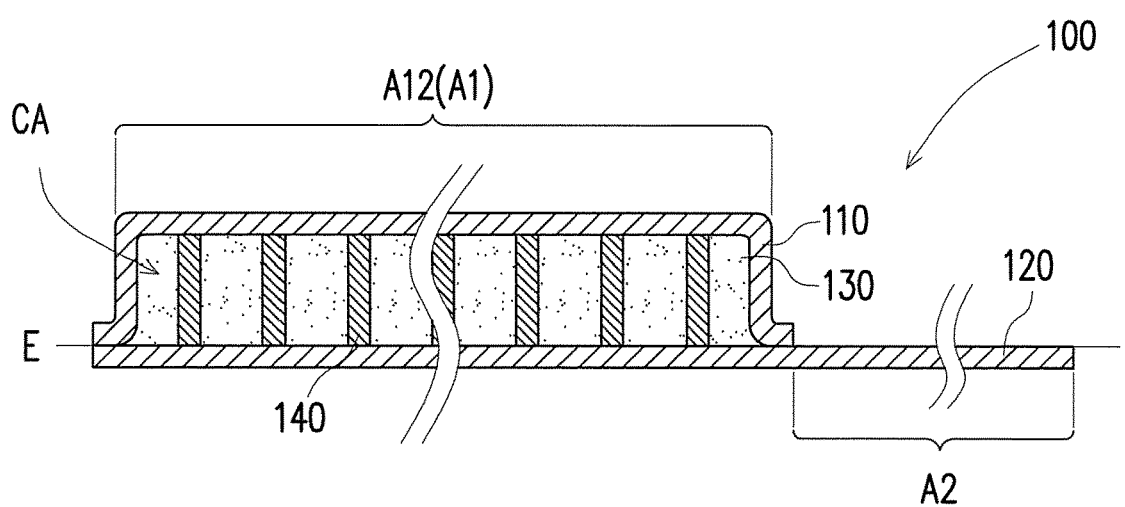
FIG. 3 is a schematic cross-sectional view of the heat transferring module in FIG. 1 along line B-B.
Figure 4:
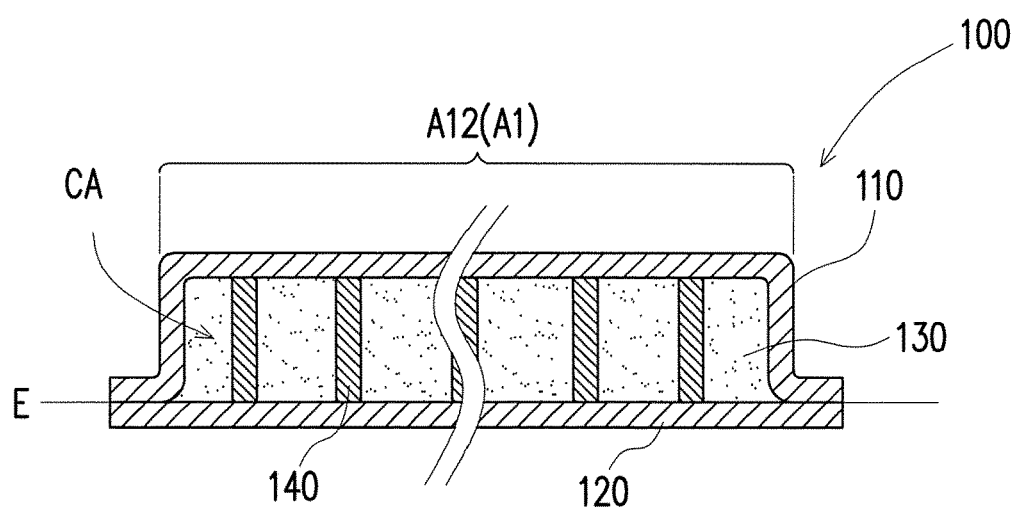
FIG. 4 is a schematic cross-sectional view of the heat transferring module in FIG. 1 along line C-C.

FIG. 1 is a schematic top view of a heat transferring module according to an embodiment of the invention. FIG. 2 is a schematic cross-sectional view of the heat transferring module in FIG. 1 along line A-A. FIG. 3 is a schematic cross-sectional view of the heat transferring module in FIG. 1 along line B-B. FIG. 4 is a schematic cross-sectional view of the heat transferring module in FIG. 1 along line C-C. Referring to FIG. 1 to FIG. 4, in the present embodiment, a heat transferring module 100 is adapted to contact a heating element 50, and to transfer heat emitted by the heating element 50 to a heat dissipating element such as a fan or heat dissipation fins or the outside by heat conduction, so as to achieve the effect of heat dissipation. The heating element 50 is, for example, a CPU, a processing chip or any other electronic component capable of generating heat, of a portable electronic apparatus (e.g., a smartphone or the like). The heat transferring module 100 has a first area A1 and a second area A2, wherein the first area A1 transfers heat by heat convection, and the second area A2 transfers heat by heat conduction. Therefore, the heat emitted by the heating element 50 may be transferred to the heat dissipating element such as the fan or the heat dissipation fins or the outside by heat convection of the first area A1 and by heat conduction of the second area A2, so as to achieve the effect of heat dissipation.

In detail, in a horizontal direction, the first area A1 is configured to contact the heating element 50, and the second area A2 is connected to the first area A1 along an extension direction of a reference plane E. In the present embodiment, in a vertical direction, an orthogonal projection of the heating element 50 on the reference plane E is located within an orthogonal projection of the first area A1 on the reference plane E. However, in other embodiments, the orthogonal projection of the heating element 50 on the reference plane E and the orthogonal projection of the first area A1 on the reference plane E may partially overlap. In the present embodiment, an orthogonal projection of the second area A2 on the reference plane E and the orthogonal projection of the heating element 50 on the reference plane E do not overlap each other, as illustrated in FIG. 2. However, in other embodiments, the orthogonal projection of the second area A2 on the reference plane E and the orthogonal projection of the heating element 50 on the reference plane E may partially overlap.

In the present embodiment, the first area A1 and the second area A2 are arranged in the horizontal direction, and the first area A1 is located between the second area A2 and the heating element 50. Thus, the heat emitted by the heating element 50 is first conducted in a fluid heat conduction manner along arrow directions illustrated in the first area A1 in FIG. 1, and then conducted in a solid heat conduction manner along arrow directions illustrated in the second area A2 in FIG. 1, thereby achieving heat dissipation.

In the present embodiment, the heat transferring module 100 may be a vapor chamber. The heat transferring module 100 includes a first plate 110, a second plate 120 and a working fluid 130. The first plate 110 is connected to the second plate 120, and the second plate 120 extends beyond a portion of the first plate 110 in the extension direction of the reference plane E, wherein a portion of the second plate 120 and the first plate 110 jointly form a cavity CA, and the working fluid 130 is located in the cavity CA, as illustrated in FIG. 3. The portion of the second plate 120 conformal with the first plate 110 and the portion of the second plate 120 extending beyond the first plate 110 may be integrally formed. However, the application is not limited thereto.

Referring to FIG. 3, an edge of the first plate 110 is roughly aligned with an edge of the second plate 120 opposing the second area A2. Referring to FIG. 4, the edges of the first plate 110 are roughly aligned with the edges of the second plate 120 on both sides.

That is, in the present embodiment, the portion of the second plate 120 extending beyond the first plate 110 serves as the second area A2, and the first plate and another portion of the second plate jointly form the first area A1. In other embodiments, it may be a portion of the first plate 110 extending beyond the second plate 120 that serves as the second area A2. However, the application is not limited thereto. Therefore, the heat emitted by the heating element 50 may be transferred by the working fluid 130 in the first area A1 and conducted through the second plate 120 in the second area A2 to the heat dissipating element such as the fan or the heat dissipation fins or the outside, thereby achieving the heat dissipation effect. In the present embodiment, a material of the first plate 110 and the second plate 120 includes metal such as copper, and the first plate 110 and the second plate 120 are connected to each other by, for example, welding. However, the application is not limited thereto.

In addition, in the present embodiment, the heat transferring module 100 further includes a plurality of supporting structures 140 disposed in the cavity CA. The supporting structures 140 are located between the first plate 110 and the second plate 120 and form a plurality of channels in the cavity CA. Accordingly, during the heat dissipation, the heat from the heating element 50 is transferred to the first area A1, and the working fluid 130 closer to the heating element 50 is heated and evaporates into a gas, which flows upward and fills the whole cavity CA. When the evaporated working fluid 130 flows to a place relatively far from the heating element 50, since the temperature at this place is relatively lower, the working fluid 130 performs heat exchange with other media (e.g., a wick structure, the first plate 110, the second plate 120, the cold air or the like) to condense into a liquid, which then flows back by a capillary phenomenon of the first plate 110 or the second plate 120. Such evaporation and condensation operations are repeatedly performed in the cavity CA. Thus, the first area A1 may dissipate the heat emitted by the heating element 50 to the other media. In this way, the structural strength and heat dissipation effect of the first area A1 may be further improved. In addition, a microstructure or a wick structure may also be formed on the first plate 110 within the cavity CA, so as to facilitate the condensation of the working fluid 130 from a gas into a liquid.

In detail, in the present embodiment, the first area A1 further includes a first sub-area A11 and a second sub-area A12. The first sub-area A11 and the second sub-area A12 communicate with each other, and the orthogonal projection of the heating element 50 on the reference plane E is located within an orthogonal projection of the first sub-area A11 on the reference plane E. In other words, in the present embodiment, the heating element 50 overlaps and contacts the first sub-area A11. Thus, the heat emitted by the heating element 50 is transferred to the second sub-area A12 by the first sub-area A11 in a one-dimensional direction, and then transferred outside by the second sub-area A12 in a two-dimensional direction. In the present embodiment, the second sub-area A12 is distributed on at least three sides of the first sub-area A11. In addition, the orthogonal projection of the first sub-area A11 on the reference plane E extends and protrudes from a lateral side of the orthogonal projection of the heating element 50 on the reference plane E, i.e., the first sub-area A11 extends beyond the heating element 50 in the horizontal direction. However, the application is not limited thereto.

In the present embodiment, the cavity CA includes a first space C1 and a second space C2. The supporting structures 140 are located in the second space C2, and the orthogonal projection of the heating element 50 on the reference plane E is located within an orthogonal projection of the first space C1 on the reference plane E. That is, in the present embodiment, the first space C1 formed by the first plate 110 and the second plate 120 serves as the first sub-area A11 of the heat transferring module 100, the second space C2 formed by the first plate 110 and the second plate 120 serves as the second sub-area A12 of the heat transferring module 100, and the supporting structures 140 are only disposed in the second space C2. In this way, space occupied by the heat transferring module 100 in the vertical direction of the heating element 50 may further be reduced to achieve miniaturization of the electronic apparatus. More in detail, the structure located in the first sub-area A11 is similar to a heat pipe, the structure located in the second sub-area A12 is similar to a vapor chamber, and the structure located in the second area A2 is similar to a thermal plate. The overall structures in these three areas have different thicknesses from one another. Thus, the heat transferring module 100 of the present embodiment is further applicable to an electronic apparatus having limited internal space.

In the heat transferring module 100 of the present embodiment, the second plate 120 extends beyond the first plate 110 by a portion thereof, and this portion may serve as a thermal plate to enhance heat dissipation efficiency. Therefore, in the heat transferring module 100 of the present embodiment, the structure in the second sub-area A12 serving as the vapor chamber may be integrated with the structure in the second area A2 serving as the thermal plate. In addition, the structure in the first sub-area A11 serving as the heat pipe is further integrated into in the heat transferring module 100 of the present embodiment. In brief, the heat transferring module 100 of the present embodiment includes the structure in the second sub-area A12 serving as the vapor chamber, the structure in the second area A2 serving as the thermal plate and the structure in the first sub-area A11 serving as the heat pipe, thereby providing the greatest heat dissipation efficiency in the electronic apparatus having limited internal space.

In the present embodiment, the first sub-area A11 (i.e., the first space C1) is formed by the first plate 110 in an integral manner. An orthogonal projection of the second plate 120 on the reference plane E and the orthogonal projection of the heating element 50 on the reference plane E do not overlap each other. In other words, the first space C1 may be formed by directly stretching a portion of the first plate 110, so as to arrange the second space C2 on a lateral side of the heating element 50, thereby reducing the space occupied by the heat transferring module 100 in the vertical direction of the heating element 50, so as to achieve miniaturization of the electronic apparatus. However, in other embodiments, a heat conducting structure having the first space C1, for example, a heat pipe, may be additionally arranged so as to enable the first space C1 to communicate with the second space C2. However, the application is not limited thereto. In addition, in other embodiments, the orthogonal projection of the second plate 120 on the reference plane E and the orthogonal projection of the heating element 50 on the reference plane E may also partially overlap.

Figure 5:
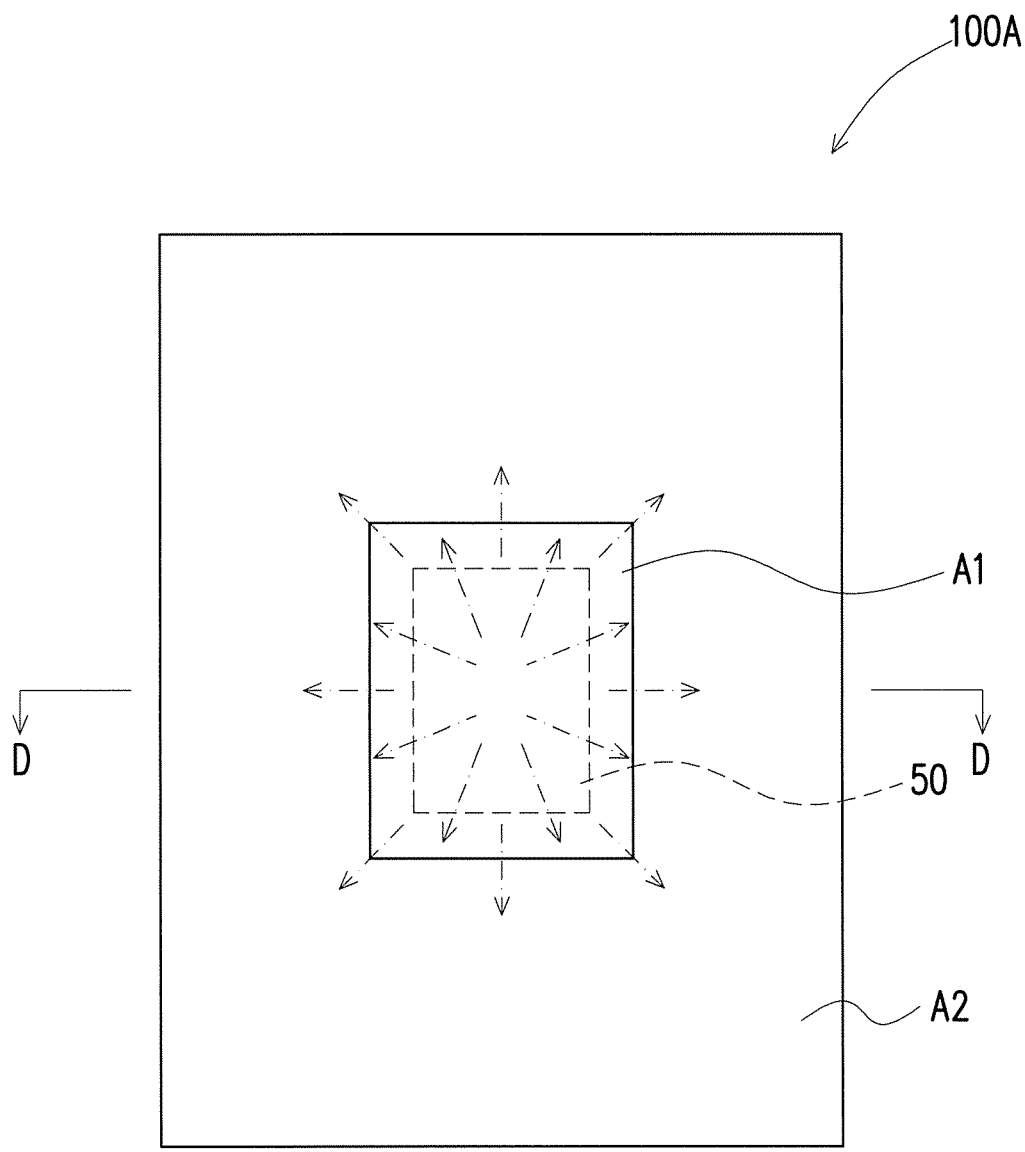
FIG. 5 is a schematic top view of a heat transferring module according to another embodiment of the invention.
Figure 6:
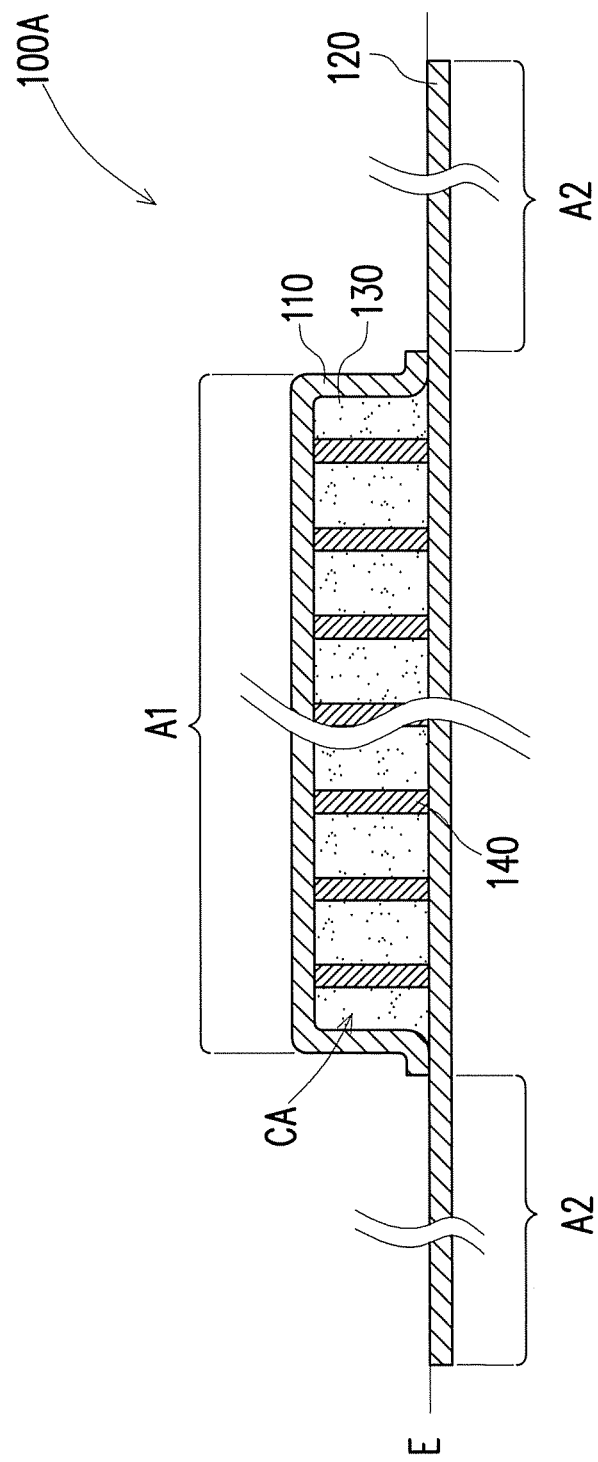
FIG. 6 is a schematic cross-sectional view of the heat transferring module in FIG. 5 along line D-D.

FIG. 5 is a schematic top view of a heat transferring module according to another embodiment of the invention. FIG. 6 is a schematic cross-sectional view of the heat transferring module in FIG. 5 along line D-D. Referring to FIG. 5 and FIG. 6, a heat transferring module 100A of the present embodiment is similar to the heat transferring module 100 in FIG. 1, wherein the two differ in that, in the present embodiment, the second area A2 surrounds the first area A1, and the structure located in the second area A2 is similar to a thermal plate. In other words, the second plate 120 may extend beyond the first plate 110 on any side in the horizontal direction. The extending second plate 120 may further be connected to a heat dissipating element of a fan or heat dissipation fins, a casing or a frame, thereby enhancing the heat dissipation effect. As in the above-mentioned embodiment, the structure located in the first area A1 is similar to a vapor chamber, and the structure located in the second area A2 is similar to a terminal plate. In addition, an overall thickness of the structure located in the first area A1 is different from an overall thickness of the structure located in the second area A2, thus reducing space occupied by the heat transferring module 100A in the electronic apparatus.

Figure 7:
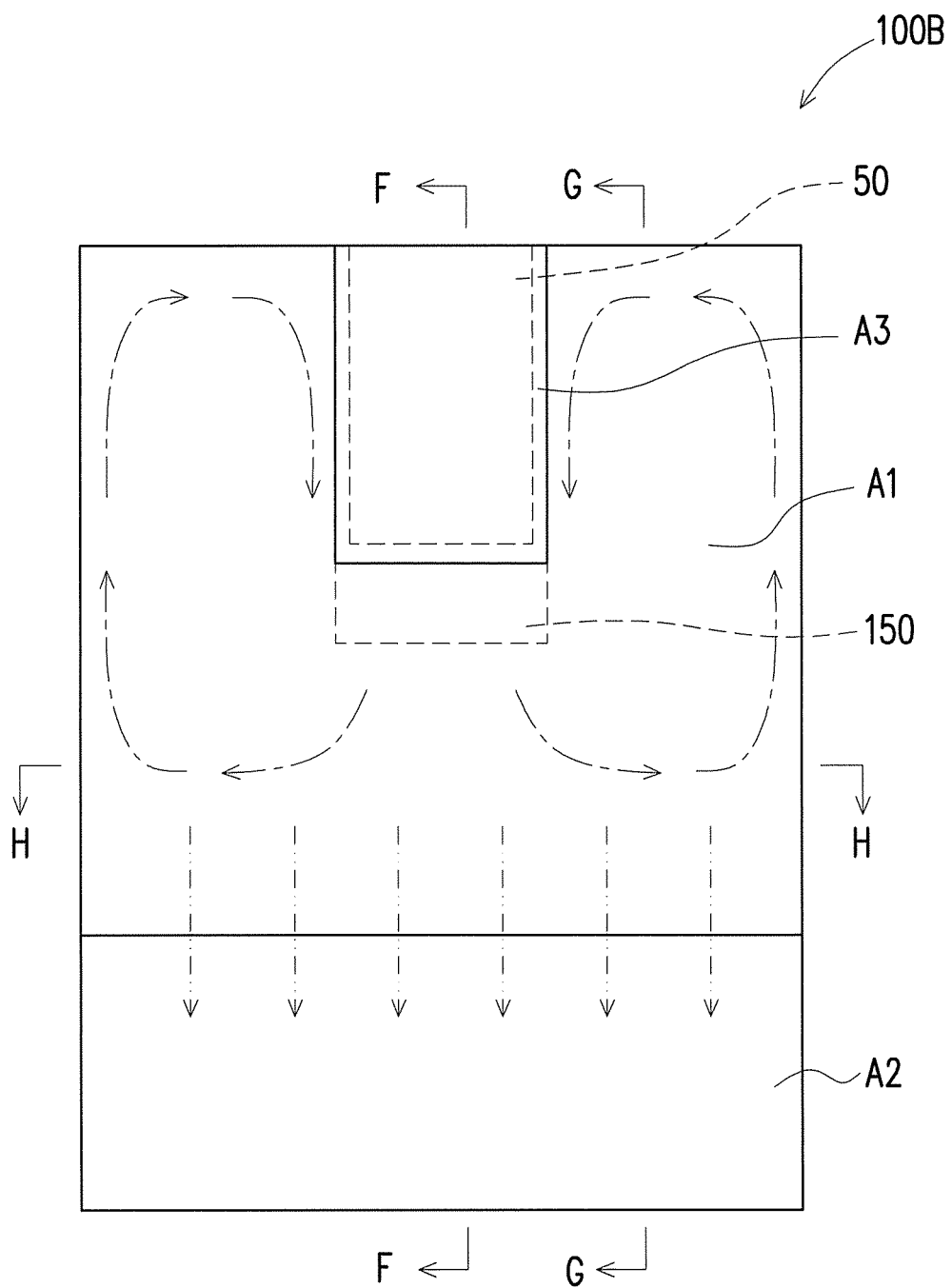
FIG. 7 is a schematic top view of a heat transferring module according to another embodiment of the invention.
Figure 8:
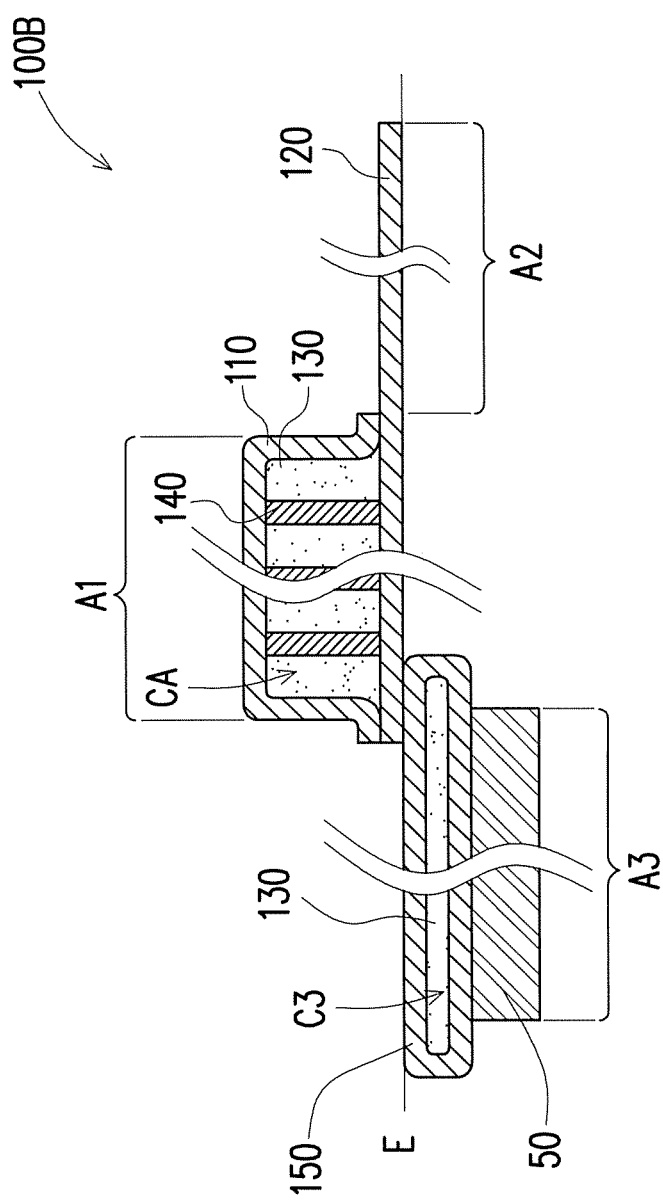
FIG. 8 is a schematic cross-sectional view of the heat transferring module in FIG. 7 along line F-F.

FIG. 7 is a schematic top view of a heat transferring module according to another embodiment of the invention. FIG. 8 is a schematic cross-sectional view of the heat transferring module in FIG. 7 along line F-F. FIG. 9 is a schematic cross-sectional view of the heat transferring module in FIG. 7 along line G-G. FIG. 10 is a schematic cross-sectional view of the heat transferring module in FIG. 7 along line H-H. Referring to FIG. 7 to FIG. 10, a heat transferring module 100B of the present embodiment is similar to the heat transferring module 100 in FIG. 1, wherein the two differ in that, in the present embodiment, the heat transferring module 100B further includes a heat pipe 150 disposed between the cavity CA and the heating element 50, wherein the heat pipe 150 has a third space C3 being a third area A3, and a direction in which the third area A3 transfers heat is one-dimensional. In other words, in the present embodiment, the cavity CA does not communicate with the third space C3 of the heat pipe 150. In the present embodiment, the same working fluid 130 as that in the cavity CA is filled into the third space C3. However, in other embodiments, there may be no filling. The application is not limited thereto.

Therefore, in the same manner of transferring heat by the first sub-area A11 as shown in FIG. 1, the heat pipe 150 transfers heat along the one-dimensional direction from the heating element 50 to the first area A1. Then, by the cavity CA in the first area A1, the heat is transferred in a two-dimensional direction from the third area A3 to the second area A2. In addition, in the present embodiment, the first plate 110 is connected and fixed along one side surface of an edge P of the second plate 120 to the another side surface opposing the one side surface. In this way, structural strength of a junction where the first plate 110 and the second plate 120 are connected to each other may further be improved, so as to reduce the chance of the working fluid 130 flowing outside.

Figure 11:
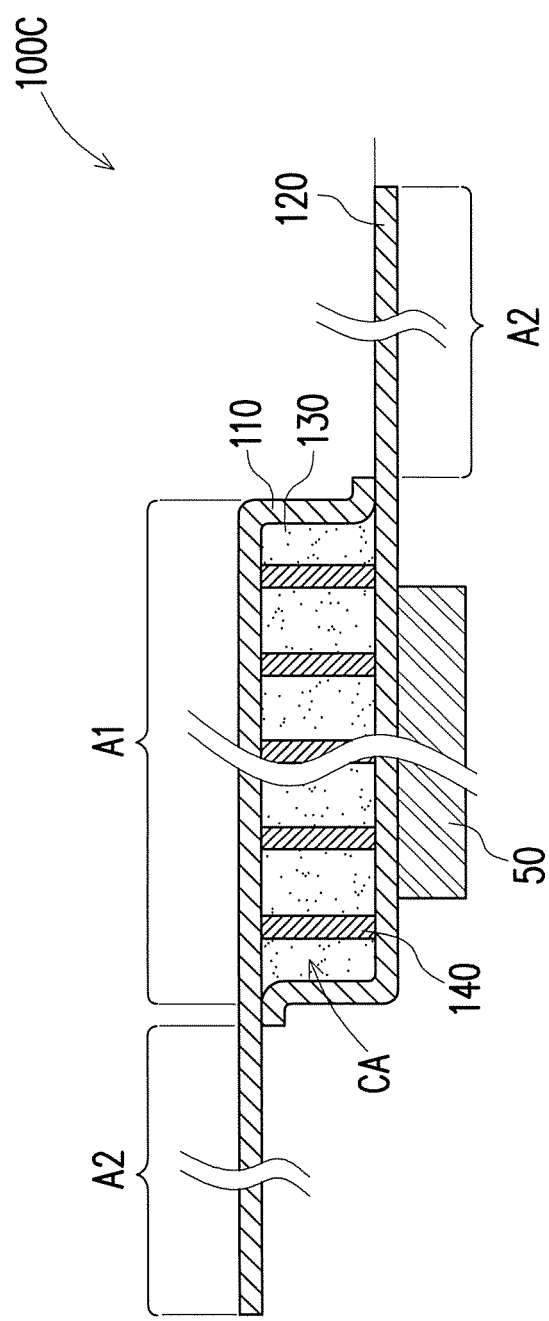
FIG. 11 is a schematic cross-sectional view of a heat transferring module according to another embodiment of the invention.

FIG. 11 is a schematic cross-sectional view of a heat transferring module according to another embodiment of the invention. Referring to FIG. 11, a heat transferring module 100C of the present embodiment is similar to the heat transferring module 100 in FIG. 3, wherein the two differ in that, in the present embodiment, the first plate 110 and the second plate 120 respectively extend beyond two opposing sides of the cavity CA to form the second area A2. In this way, the heat transferring module 100C may be applied to other types of frames having a height difference and may achieve a better heat dissipation effect. In other words, the second area A2 is formed by either the first plate 110 or the second plate 120. Therefore, in some embodiments, the heat transferring module 100B may be adapted to different types of electronic apparatuses by changing the extension direction or the shape of the second area A2. However, the application is not limited thereto.

In summary, the heat transferring module of the application has the first area and the second area connected to each other in the horizontal direction. In addition, in the vertical direction, the heating element and the first area partially overlap, while the heating element and the second area do not overlap each other. Thus, the heat emitted by the heating element may first be transferred to the second area by heat convection of the first area, and then be transferred to the heat dissipating element or the outside by heat conduction of the second area, so as to achieve the effect of heat dissipation. Meanwhile, the space occupied by the heat transferring module may be reduced. More in detail, in the heat transferring module of the application, the first plate and the second plate are combined to form a vapor chamber, and the portion of the second plate extending beyond the first plate serves as a thermal plate. In addition, the heat transferring module of the application has different thicknesses in different areas. Therefore, the heat transferring module of the application is applicable to an electronic apparatus having limited internal space. Further, the heat transferring module of the application is capable of providing sufficient heat dissipation efficiency.

Although the invention has been described with reference to the above embodiments, the invention is not limited to the above embodiments. It is apparent to one of ordinary skill in the art that modifications and variations to the described embodiments may be made without departing from the spirit and scope of the invention. Accordingly, the scope of the invention will be defined by the attached claims.

What is claimed is:

1. A heat transferring module adapted to contact a heating element, comprising:
a first plate;
a second plate connected to the first plate to form a cavity therewith, the cavity extending along an extension direction of a reference plane, wherein the reference plane extends along a longitudinal direction of the heat transferring module; and a working fluid located in the cavity, wherein the cavity is a first area, a portion of the first plate or a portion of the second plate extending beyond the cavity is a second area, the first area transfers heat by heat convection, the second area transfers heat by heat conduction, the first area and the second area are directly connected, and the first plate has an end portion extending parallelly with the second plate along the longitudinal direction of the heat transferring module, and the second plate extends further than the end portion of the first plate toward a direction away from the cavity;

wherein the first plate and the second plate are completely non-overlapped with each other along the extension direction within the second area, a distal edge of the second plate within the second area is completely non-overlapped with the first plate, the first plate and the second plate within the first area are completely overlapped with each other, and the second plate within the second area keeps extending along the extension direction and is non self-overlapped, the cavity comprises a first space and a second space, the first space is only enclosed by the first plate, the second space is arranged on a lateral side of the heating element, and the heat transferring module further comprising a plurality of supporting structures located in the second space.

2. The heat transferring module according to claim 1, wherein the first area comprises a first sub-area and a second sub-area, the first sub-area transfers heat in a one-dimensional direction, the second sub-area transfers heat in a two-dimensional direction, and the heating element contacts the first sub-area.

3. The heat transferring module according to claim 2, wherein the second sub-area is distributed on at least three sides of the first sub-area.

4. The heat transferring module according to claim 2, wherein an orthogonal projection of the first sub-area on the reference plane extends and protrudes from a lateral side of an orthogonal projection of the heating element on the reference plane.

5. The heat transferring module according to claim 1, wherein the supporting structures are located between the first plate and the second plate and form a plurality of channels in the cavity.

6. The heat transferring module according to claim 5, wherein an orthogonal projection of the heating element on the reference plane and an orthogonal projection of the first space on the reference plane at least partially overlap.

7. The heat transferring module according to claim 6, wherein the first space is formed by the first plate in an integral manner.

* * * * *